（12）United States Patent
Aftab (10) Patent No.: US 8,907,831 B1
(45) Date of Patent: Dec. 9, 2014

(54) HIGH-RESOLUTION DIGITAL TO ANALOG CONVERTER

(71) Applicant: Maxim Integrated Products, Inc., San Jose, CA (US)

(72) Inventor: Syed Amir Aftab, Gilbert, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/136,728

(22) Filed: Dec. 20, 2013

Related U.S. Application Data

(60) Provisional application No. 61/867,305, filed on Aug. 19, 2013.

(51) Int. Cl.
  *H03M 1/66* (2006.01)
  *H03M 1/68* (2006.01)
  *H03M 1/00* (2006.01)
  *H03M 1/78* (2006.01)
  *H03M 1/74* (2006.01)

(52) U.S. Cl.
  CPC . *H03M 1/68* (2013.01); *H03M 1/00* (2013.01); *H03M 1/785* (2013.01); *H03M 1/747* (2013.01)

USPC .......................................... 341/145; 341/144

(58) Field of Classification Search
  CPC ........ H03M 1/00; H03M 1/747; H03M 1/785
  USPC .......... 341/145, 144, 154, 153, 136; 327/103, 327/553, 563
  See application file for complete search history.

(56) References Cited

U.S. PATENT DOCUMENTS 6,346,899 B1 * 2/2002 Hadidi ........................ 341/144

* cited by examiner

*Primary Examiner* — Joseph Lauture (57) ABSTRACT

A system includes an N-bit digital-to-analog converter and an M-bit sub-digital-to-analog converter. The N-bit digital-to-analog converter includes $2^N$ resistances connected in series across first and second reference voltages and converts N most significant bits of B bits of data. The M-bit sub-digital-to-analog converter converts M least significant bits of the B bits of data. The M-bit sub-digital-to-analog converter includes a first converter that converts a voltage across one of the $2^N$ resistances to a first current, a current-mode digital-to-analog converter that interpolates the first current and outputs a second current, and a second converter that converts the second current to an output voltage representing the N most significant bits and the M least significant bits of the B bits of data.

19 Claims, 12 Drawing Sheets

HIGH-RESOLUTION DIGITAL TO ANALOG CONVERTER

CROSS-REFERENCE TO RELATED APPLICATIONS

This application claims the benefit of U.S. Provisional Application No. 61/867,305, filed on Aug. 19, 2013. The entire disclosure of the application referenced above is incorporated herein by reference.

FIELD

The present disclosure relates to high-resolution digital-to-analog converters.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

High-resolution digital-to-analog converters (DACs) suffer from high component count and area penalty. One approach to lower the high component count and area penalty is to segment the DAC such that a primary DAC converts the most significant bits of data and a sub-DAC converts the least significant bits of the data. Outputs of the primary and sub-DACs are combined to generate the output of the combined DAC. The sub-DAC must be linear only to the least significant bit level allowing a reduction in the size requirement of the sub-DAC. Any reduction in the sub-DAC component count and area reduces the overall DAC component count and area. The sub-DAC, however, loads the primary DAC, causing linearity errors, glitches, and cross-talk. In some sub-DAC architectures, linearity errors can be removed, but glitches and cross-talk remain due to capacitive loading. Minimizing the sub-DAC capacitive loading on the primary DAC reduces these errors.

SUMMARY

A system comprises an N-bit digital-to-analog converter and an M-bit sub-digital-to-analog converter. The N-bit digital-to-analog converter comprises $2^N$ resistances connected in series across first and second reference voltages and converts N most significant bits of B bits of data. The M-bit sub-digital-to-analog converter converts M least significant bits of the B bits of data. The M-bit sub-digital-to-analog converter comprises a first converter that converts a voltage across one of the $2^N$ resistances to a first current, a current-mode digital-to-analog converter that interpolates the first current and outputs a second current, and a second converter that converts the second current to an output voltage representing the N most significant bits and the M least significant bits of the B bits of data.

In another feature, the system further comprises a second M-bit sub-digital-to-analog converter channel that converts M least significant bits of second B bits of data. The N-bit digital-to-analog converter converts N most significant bits of the second B bits of data.

In another feature, the first converter includes a differential difference amplifier that outputs the first current through a first resistance to the current-mode digital-to-analog converter and that receives voltages at first and second terminals of the first resistance as feedback.

In another feature, a first input of the differential difference amplifier is connected to a first node formed by first terminals of two of the $2^N$ resistances and a second input of the differential difference amplifier is connected to a second terminal of a first of the two resistances at a first time and to a second terminal of a second of the two resistances at a second time.

In another feature, the second converter includes a buffer having a first input connected to an output of the current-mode digital-to-analog converter, a second input connected to the second input of the differential difference amplifier, and an output connected to the first input of the buffer via a second resistance that is equal to the first resistance.

In another feature, the system further comprises a plurality of charge pumps connected to the differential difference amplifier that allows the first reference voltage to be raised to a supply voltage and that allows the buffer to operate in a unity gain configuration.

In another feature, the buffer has a gain of greater than 1.

In another feature, the system further comprises a continuous time differential difference offset nulling amplifier that has first and second inputs respectively connected to the first and second inputs of the differential difference amplifier, that receives the voltages at the first and second terminals of the first resistance as feedback, and that removes offset and common-mode rejection ratio errors from an output of the differential difference amplifier.

In another feature, the continuous time differential difference offset nulling amplifier allows use of complementary metal-oxide semiconductor field-effect transistors as input devices in the differential difference amplifier to allow rail-to-rail operation without CMRR degradation instead of using a plurality of charge pumps.

In still other features, a method comprises converting N most significant bits of B bits of data using an N-bit digital-to-analog converter comprising $2^N$ resistances connected in series across first and second reference voltages. The method further comprises converting M least significant bits of the B bits of data using an M-bit sub-digital-to-analog converter. The method further comprises, in the M-bit sub-digital-to-analog converter, converting a voltage across one of the $2^N$ resistances to a first current, interpolating the first current to output a second current, and converting the second current to an output voltage representing the N most significant bits and the M least significant bits of the B bits of data.

In other features, the method further comprises converting M least significant bits of second B bits of data using a second M-bit sub-digital-to-analog converter, and converting N most significant bits of the second B bits of data using the N-bit digital-to-analog converter.

In other features, the method further comprises converting the voltage across one of the $2^N$ resistances to the first current using a differential difference amplifier, interpolating the first current using a current-mode digital-to-analog converter, outputting the first current through a first resistance to the current-mode digital-to-analog converter, and providing feedback of voltages generated at first and second terminals of the first resistance to the differential difference amplifier.

In other features, the method further comprises connecting a first input of the differential difference amplifier to a first node formed by first terminals of two of the $2^N$ resistances, and connecting a second input of the differential difference amplifier to a second terminal of a first of the two resistances at a first time and to a second terminal of a second of the two resistances at a second time.

In other features, the method further comprises converting the second current to the output voltage using a second converter, connecting a first input of the second converter to an output of the current-mode digital-to-analog converter, connecting a second input of the second converter to the second input of the differential difference amplifier, and providing feedback from an output of the second converter to the first input of the second converter via a second resistance that is equal to the first resistance.

In another feature, the method further comprises coupling a plurality of charge pumps to the differential difference amplifier to allow the first reference voltage to be raised to a supply voltage and to allow the second converter to operate in a unity gain configuration.

In another feature, the method further comprises operating the second converter with a gain of greater than 1.

In other features, the method further comprises connecting first second inputs of a continuous time differential difference offset nulling amplifier to the first and second inputs of the differential difference amplifier, providing feedback of the voltages at the first and second terminals of the first resistance to the continuous time differential difference offset nulling amplifier, and removing offset and common-mode rejection ratio errors from an output of the differential difference amplifier.

In another feature, the method further comprises using the continuous time differential difference offset nulling amplifier to allow use of complementary metal-oxide semiconductor field-effect transistors as input devices in the differential difference amplifier instead of using a plurality of charge pumps to allow the first reference voltage to be raised to a supply voltage and to allow the second converter to operate in a unity gain configuration.

In another feature, the method further comprises operating the second converter with a gain of greater than 1.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to a digital-to-analog converter (DAC) architecture comprising an N-bit primary DAC that converts N most significant bits of data and a DAC channel that converts M least significant bits of the data. The DAC channel comprises a voltage-to-current (V-I) converter that converts a voltage across a resistive element of the primary DAC into a current, an M-bit current-mode DAC that interpolates the current, and a current-to-voltage (I-V) converter that converts the current output by the M-bit current-mode DAC into a voltage that is an analog representation of the (M+N) bits of data. Charge pumps in the tail current source of the input differential pairs allow the first reference voltage to be raised to the supply voltage. Using charge pumps also allows use of a unity gain buffer instead of using an amplifier with a gain $\geq 2$, which can amplify noise.

The present disclosure also relates to a multichannel digital-to-analog converter (DAC) architecture comprising a single primary DAC that converts most significant bits of data and a plurality of sub-DACs that share the primary DAC and that convert least significant bits of respective data. Accordingly, component count, die area, and power consumption of the DAC architecture can be reduced.

According to the present disclosure, a plurality of DAC channels can be integrated on a single die, where each DAC channel can convert B bits of data. Each DAC channel may convert a different set of B bits than the other DAC channels. In addition, each DAC channel may convert a different type of data that the other DAC channels. Each DAC channel uses the same primary DAC to convert N most significant bits of the B bits of data converted by the respective DAC channel. Each DAC channel uses a separate sub-DAC to convert M least significant bits of the B bits of data converted by the respective DAC channel.

For example, the primary DAC may include a string of $2^N$ resistors connected across two reference voltages. Each DAC channel includes a V-I converter, a current-mode DAC, and an output buffer. The V-I converter converts a voltage across a resistor in the primary DAC to a current. The current-mode DAC is an (B-N) or M-bit sub-ranging DAC that interpolates or divides the current based on the lower order bits in the data. The buffer is a wide common mode range buffer that converts the divided current into an output voltage. The output voltage of the buffer in a DAC channel is an analog representation of the (N+M) bits converted by the primary DAC and the DAC channel.

The current-mode sub-DAC is used to increase the resolution of the resulting DAC architecture while yielding a smaller die-area and component count penalty. Each sub-DAC minimally loads the primary DAC and reduces glitch and cross-talk, which can allow sharing of the primary DAC across multiple channels. Sharing the primary DAC across multiple channels results in reduced noise due to a reduced size of resistors used in the resistor string in the primary DAC.

Figure 1A:
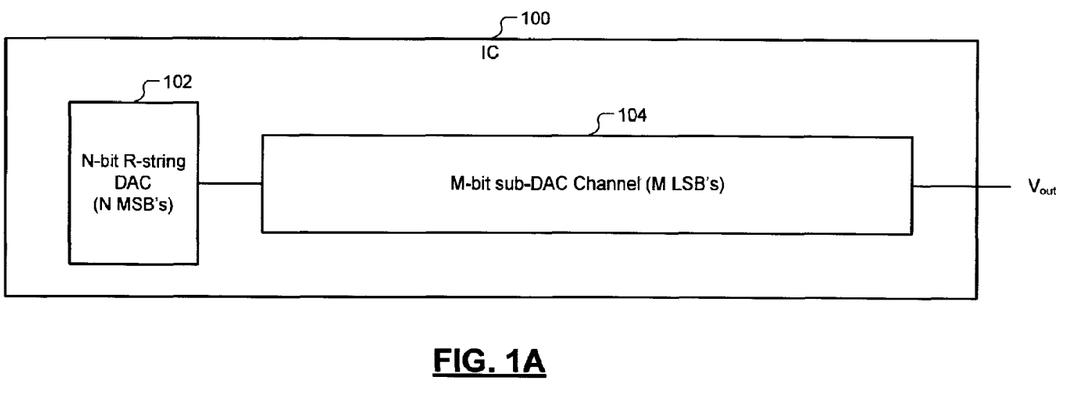
FIG. 1A is a functional block diagram of a digital-to-analog converter (DAC) architecture comprising a single resistive DAC and a single sub-DAC.

Referring now to FIG. 1A, an integrated circuit (IC) 100 according to the present disclosure is shown. The IC 100 includes one DAC channel comprising a first DAC 102 and a sub-DAC 104. The first DAC 102 is an N-bit resistive DAC including a string of $2^N$ resistors connected across two reference voltages. The DAC channel may receive B bits of data including N most significant bits and M least significant bits. The first DAC 102 converts N most significant bits of data received by the DAC channel. The sub-DAC 104 converts the remaining M least significant bits of data received by the DAC channel. The DAC channel generates an output that is an analog representation of (N+M) bits of data converted by the first DAC 102 and the sub-DAC 104. The IC 100 is described below in detail.

Figure 1B:
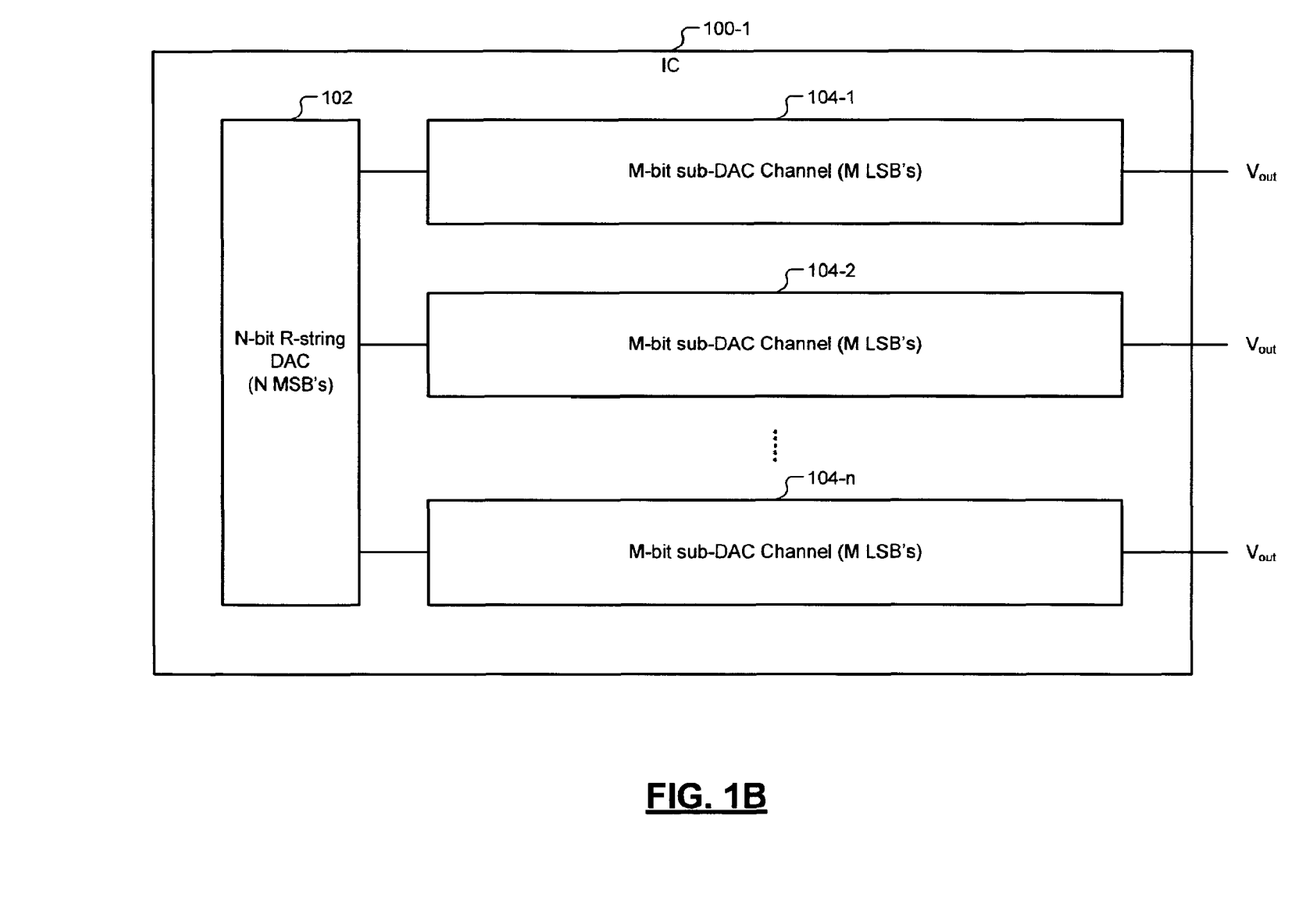
FIG. 1B is a functional block diagram of an integrated circuit with multiple digital-to-analog converter (DAC) channels comprising the single resistive DAC that is shared by multiple sub-DACs.

Referring now to FIG. 1B, an IC 100-1 according to the present disclosure is shown. The IC 100-1 includes the first DAC 102 and a plurality of sub-DAC channels 104-1, 104-2, . . . , and 104-n (collectively sub-DAC channels 104). The first DAC 102 is an N-bit resistive DAC including a string of $2^N$ resistors connected across two reference voltages. Each DAC channel may receive B bits of data including N most significant bits and M least significant bits. The first DAC 102 converts N most significant bits of data received by each DAC channel. Each sub-DAC 104 converts the remaining M least significant bits of data received by the respective DAC channel. Each sub-DAC 104 shares the first DAC 102 and generates an output that is an analog representation of (N+M) bits of data converted by the first DAC 102 and the respective sub-DAC 104. The DAC 100-1 is described below in detail.

Figure 2A:
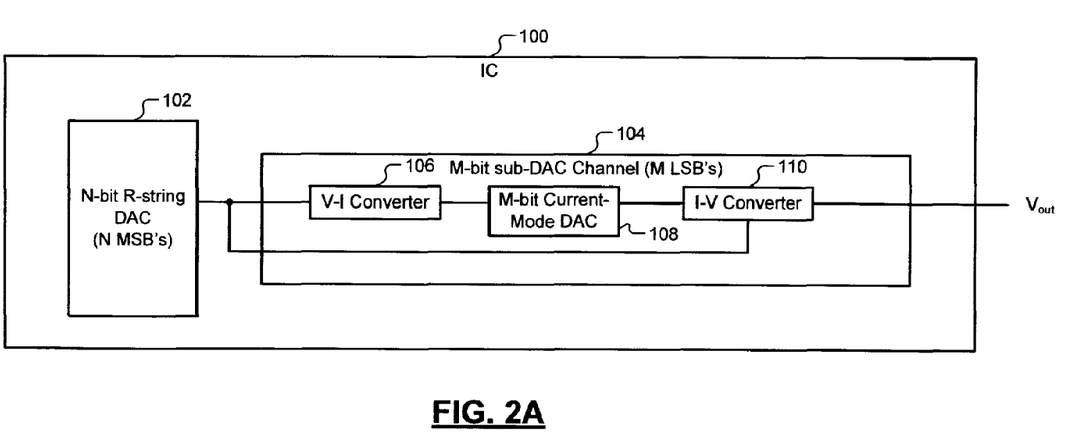
FIG. 2A is a functional block diagram of the DAC architecture showing the single DAC channel in further detail.

Referring now to FIG. 2A, the sub-DAC 104 of the IC 100 includes a voltage-to-current (V-I) converter 106, an M-bit current-mode DAC 108, and a current-to-voltage (I-V) converter 110. The V-I converter 106 converts a voltage across a resistor of the first DAC 102 into a current. The M-bit current-mode DAC 108 interpolates the current. The I-V converter 110 converts the current output by the M-bit current-mode DAC 108 into an output voltage. The I-V converter 110 also acts as an output buffer for the DAC channel. The output voltage is an analog representation of (N+M) bits of data converted by the first DAC 102 and the sub-DAC 104.

Figure 2B:
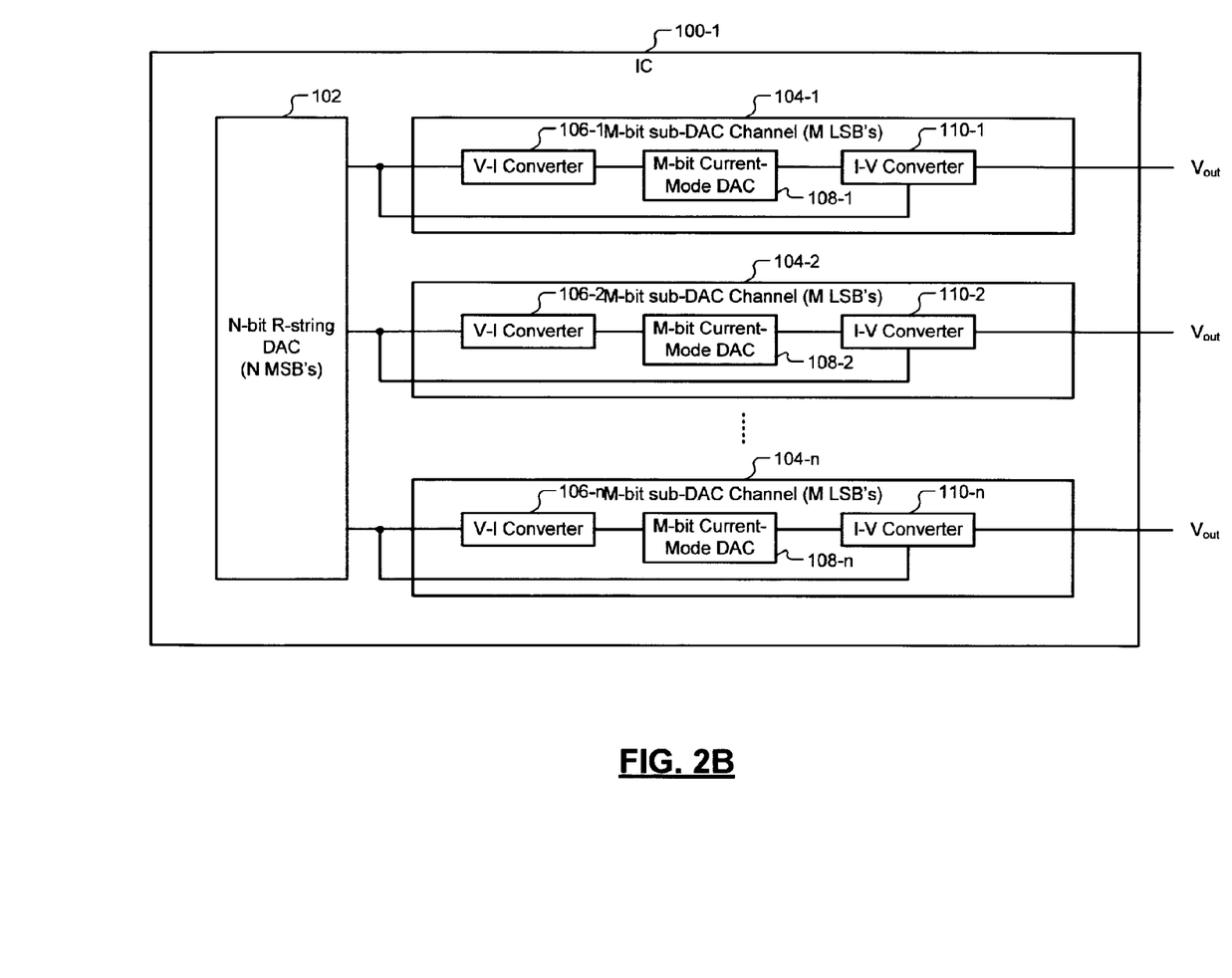
FIG. 2B is a functional block diagram of the DAC architecture showing the multiple DAC channels in further detail.

Referring now to FIG. 2B, each sub-DAC channel 104 of the IC 100-1 includes a voltage-to-current (V-I) converter 106, an M-bit current-mode DAC 108, and a current-to-voltage (I-V) converter 110. For example, the first sub-DAC 104-1 includes a V-I converter 106-1, an M-bit current-mode DAC 108-1, and an I-V converter 110-1; the second sub-DAC 104-2 includes a V-I converter 106-2, an M-bit current-mode DAC 108-2, and an I-V converter 110-2; and so on.

In each sub-DAC channel 104, the V-I converter 106 converts a voltage across a resistor of the first DAC 102 into a current. The M-bit current-mode DAC 108 interpolates the current. The I-V converter 110 converts the current output by the M-bit current-mode DAC 108 into an output voltage. The output voltage is an analog representation of (N+M) bits of data converted by the first DAC 102 and one of the DAC channels 104.

Figure 3A:
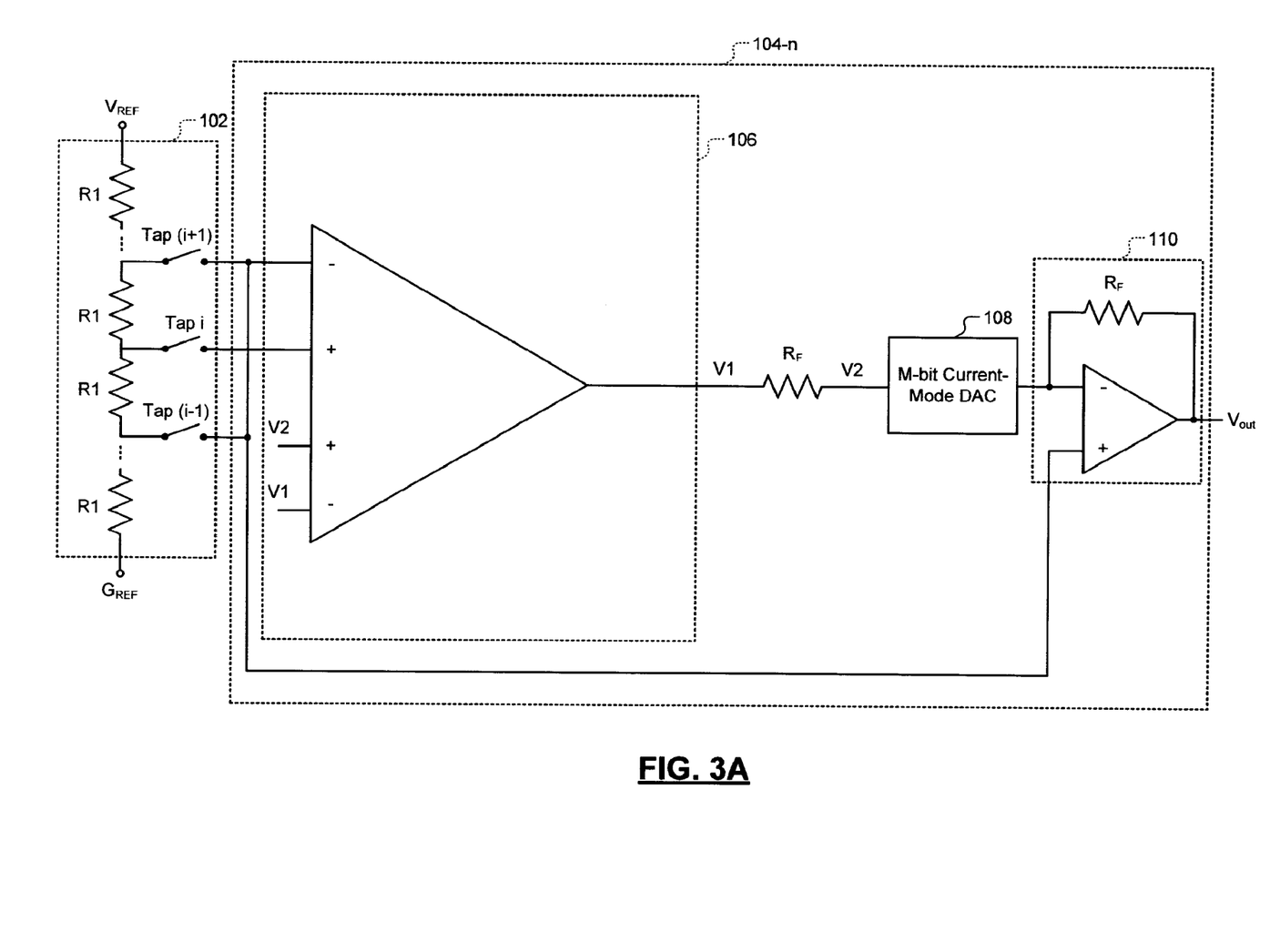
FIG. 3A is a schematic of the resistive DAC and one of the multiple DAC channels.
Figure 3B:
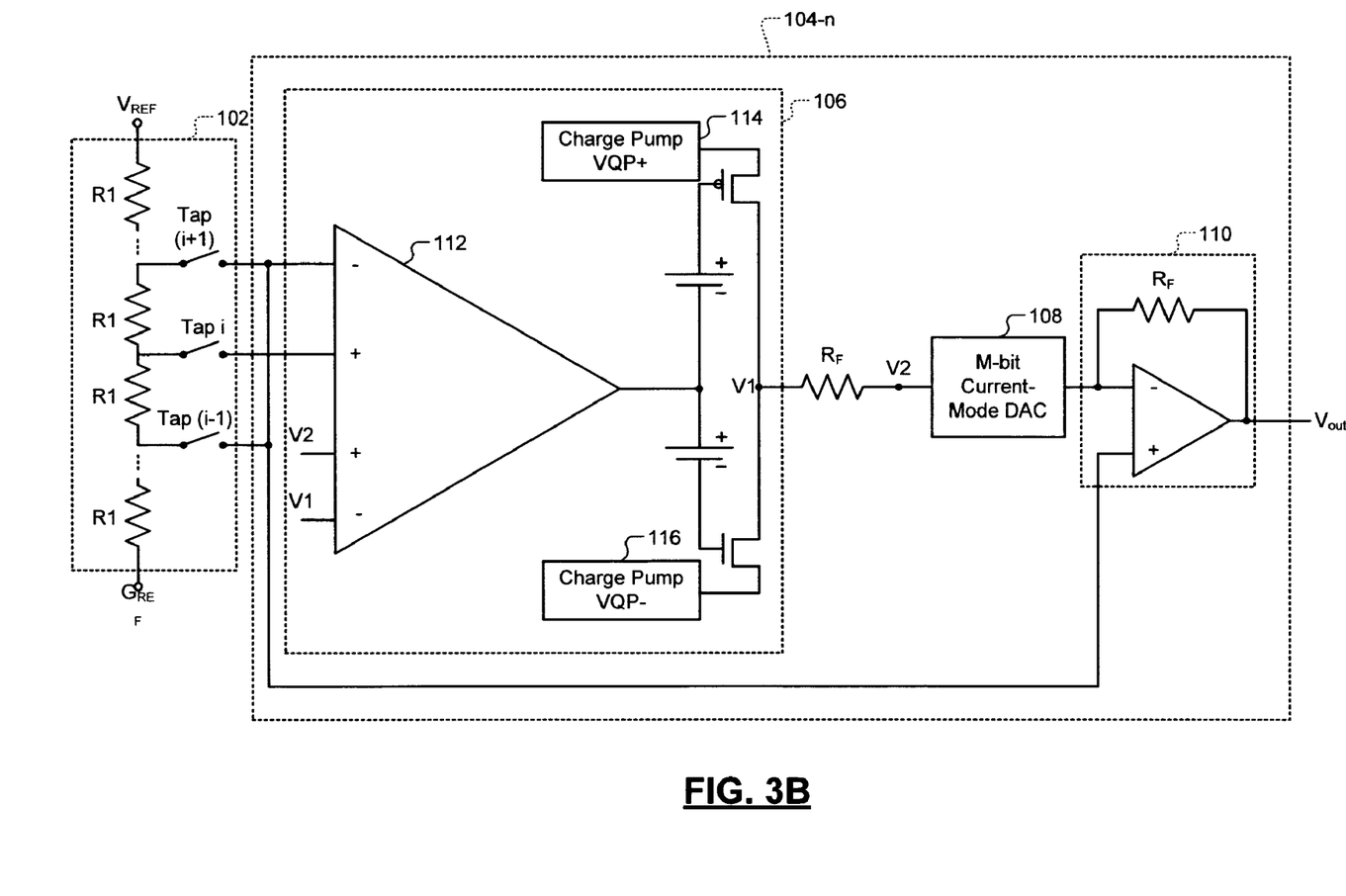
FIG. 3B is a schematic of the resistive DAC and one of the multiple DAC channels including charge pumps at an output of a differential difference amplifier of the DAC channel.

Referring now to FIGS. 3A and 3B, the first DAC 102 and one of the sub-DAC channels 104 (e.g., 104-n) is shown in detail. Other sub-DAC channels 104 are similar to the DAC channel 104-n and connect to the first DAC 102 in a similar manner. The description presented with reference to one of the sub-DAC channels 104 of the DAC 100-1 also applies to the single sub-DAC channel 104 of the IC 100.

In FIG. 3A, the first DAC 102 includes the string of $2^N$ equal resistors connected across reference voltages $V_{REF}$ and $G_{REF}$. For example, the reference voltage $V_{REF}$ may be less than or equal to a supply voltage $V_{DD}$ supplied to the components of the IC 100, and the reference voltage $G_{REF}$ may be a common reference potential or ground potential. The first DAC 102 also includes a plurality of switches that select a resistor from the $2^N$ resistors to connect to one of the sub-DAC channels 104 as explained below.

In FIG. 3B, in the sub-DAC channel 104-n, the V-I converter 106 includes a differential difference amplifier 112 and a plurality of charge pumps 114, 116. The differential difference amplifier 106 converts a voltage across a resistor in the first DAC 102. Specifically, a first input of the differential difference amplifier 112 is connected by the switches in the first DAC 102 to a node between two adjacent resistors of the first DAC 102. The node is called a center tap and is denoted as Tap i. A second input of the differential difference amplifier 112 is connected by the switches in the first DAC 102 to a second end of a first of the two resistors (denoted as Tap (i−1) or even tap) at a first time and to a second end of the second of the two resistors (denoted as Tap (i+1) or odd tap) at a second time.

Using the switches in the first DAC 102, the input connections of the differential difference amplifier 112 in each sub-DAC channel 104 leapfrog along the resistors of the first DAC 102. The differential difference amplifier 112 in each DAC channel 104 can be connected across any resistor in the first DAC 102 at a time. The leapfrogging action removes any differential nonlinearity (DNL) errors caused by offset errors in the differential difference amplifier 112. However, integral nonlinearity (INL) errors remain and require large and complex offset trim and offset trim temperature coefficient (tempco) circuitry to correct.

The differential difference amplifier 106 includes a positive charge pump 114 and a negative charge pump 116 to allow for rail-to-rail operation. That is, the reference voltage $V_{REF}$ can be as high as the supply voltage $V_{DD}$. This allows the I-V converter 110 to be used in a unity gain configuration, which does not amplify noise. Further, the charge pumps 114, 116 are not in the signal path and therefore do not cause distortion. The output of the differential difference amplifier 106 is input to the M-bit current-mode DAC 108 through a resistor $R_F$. The voltages V1 and V2 generated by the current at the two ends of the resistor $R_F$ are fed back to the differential difference amplifier 112.

For example only, the M-bit current-mode DAC 108 may convert 9 least significant bits out of a total of 16 bits. The first DAC 102 converts the remaining 7 most significant bits of the 16 bits. Accordingly, in this example, the first DAC 102 may include a total of $2^7-1=127$ equal resistors. The M-bit current-mode DAC 108 may utilize R2R or W2W configuration for example. Alternatively, any other suitable configuration may be used.

The I-V converter 110 includes a wide common mode range buffer that converts the current output by the M-bit current-mode DAC 108 to an output voltage. The buffer uses a unity gain configuration. A first input of the buffer is connected to the output of the M-bit current-mode DAC 108. A second input of the buffer is connected to the second input of the differential difference amplifier 112. The first input of the buffer is also connected to the output of the buffer via a resistance $R_F$. The buffer has a unity gain configuration although the gain may be greater than unity.

The output voltage of the buffer can be mathematically expressed as follows.

$$V_{OUT} = V_{TAP(i-1)} + I_{SUBDAC} * R_F$$

$$I_{SUBDAC} = \pm \frac{k}{2^M} I_{FS+1} \quad k = 0, M-1$$

$$I_{FS+1} = \frac{V_{TAP(i)} - V_{TAP(i-1)}}{R_F}$$

$$V_{OUT(EVEN)} = V_{TAP(i-1)} + \frac{k}{2^M} * (V_{TAP(i)} - V_{TAP(i-1)})$$

$$V_{OUT(ODD)} = V_{TAP(i+1)} - \frac{k}{2^M} * (V_{TAP(i+1)} - V_{TAP(i)})$$

In the above equations, $I_{SUBDAC}$ denotes the current output by the M-bit current-mode DAC 108, FS denotes full-scale value, $V_{TAP}$ is selected based on the N most significant bits, and k denotes the M least significant bits.

In some implementations, additional charge pumps may be used to supply the tail source current in the input stage of the wide common mode range buffer. Accordingly, in the DAC architectures shown in FIGS. 4A-5C, while the additional charge pumps are not shown for simplicity of illustration, it should be understood that each of the DAC architectures shown in FIGS. 4A-5C may also include additional charge pumps in the buffer.

Figure 4A:
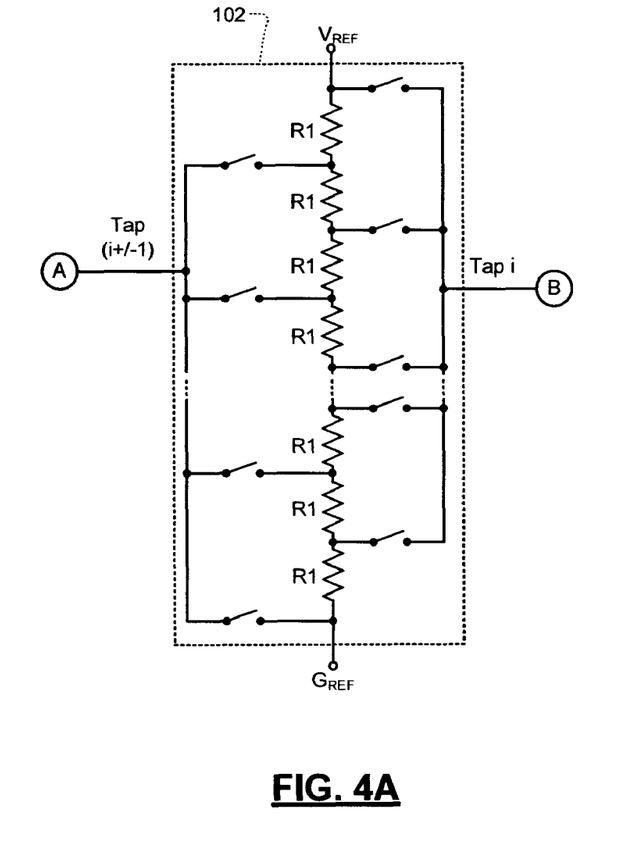
FIGS. 4A-4C depict a schematic of the DAC architecture showing an example of a configuration of a differential difference amplifier used in each of the multiple DAC channels.
Figure 4B:
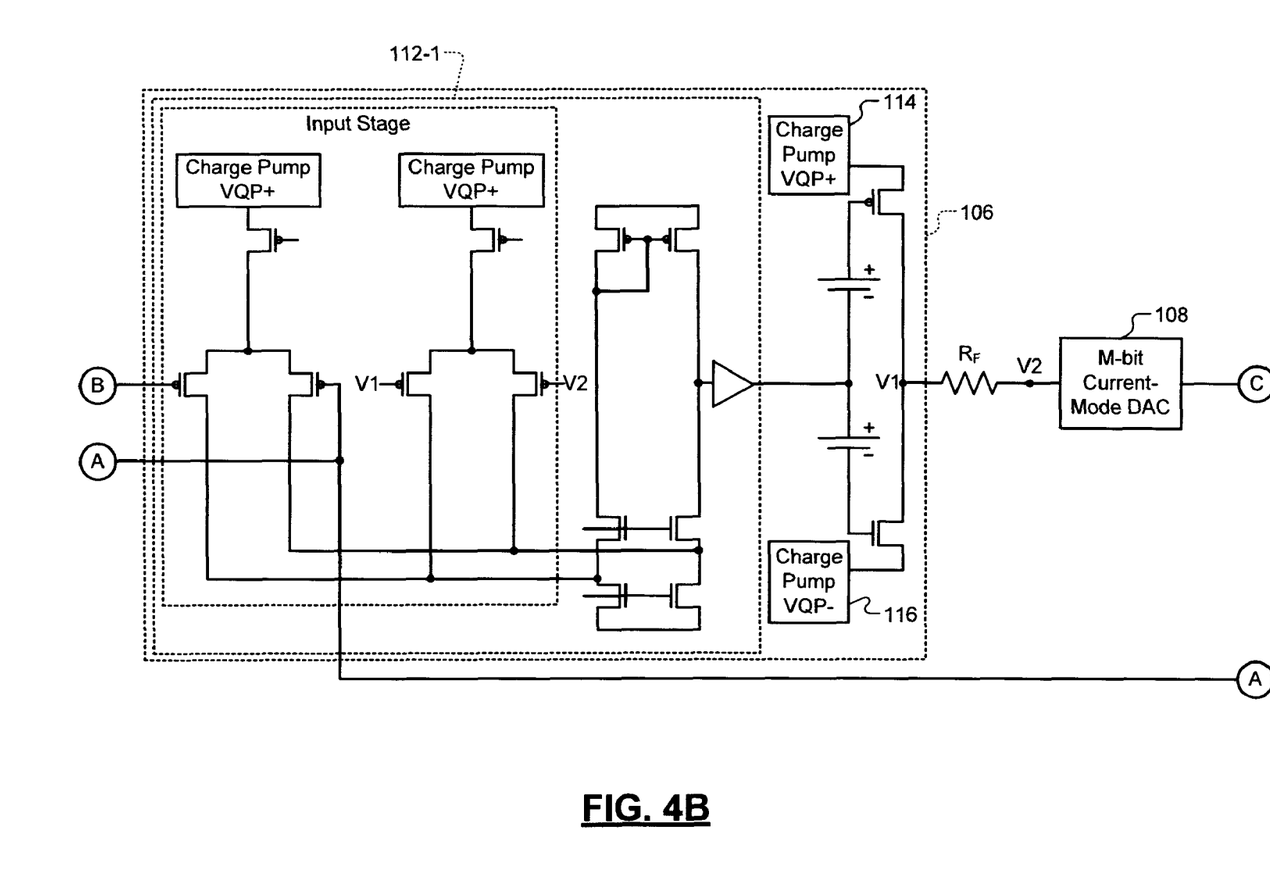
Figure 4C:
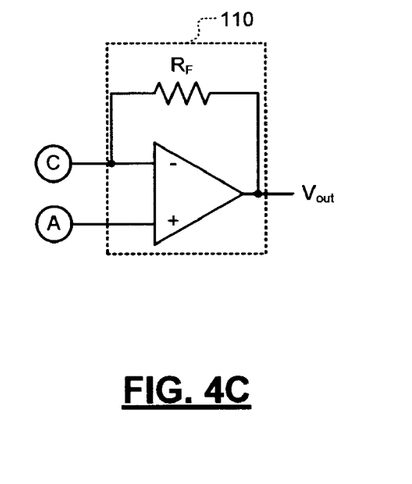

Referring now to FIGS. 4A-4C, an example of a configuration of the differential difference amplifier 112 (denoted as 112-1) is shown. For simplicity of illustration and for the sake of completeness, FIGS. 4A, 4B, and 4C respectively show the first DAC 102, the differential difference amplifier 112-1, and the I-V converter 110 of the IC 100 or the IC 100-1. In this example configuration, the differential difference amplifier 112-1 uses charge pumps in the input stage tail current sources. The charge pumps allow rail-to-rail operation (i.e., $V_{REF} = V_{DD}$) and allow the buffer to operate in a unity gain configuration. In this configuration, any offset of the differential difference amplifier 112-2 results in a linearity error. While leapfrogging techniques can be used to remove DNL errors, INL errors cannot be removed in this fashion. Traditionally, complex trim circuitry is required to remove offset and common mode rejection ratio (CMRR) errors. The trim circuitry can occupy a large die area for high-resolution DACs.

Figure 3C:
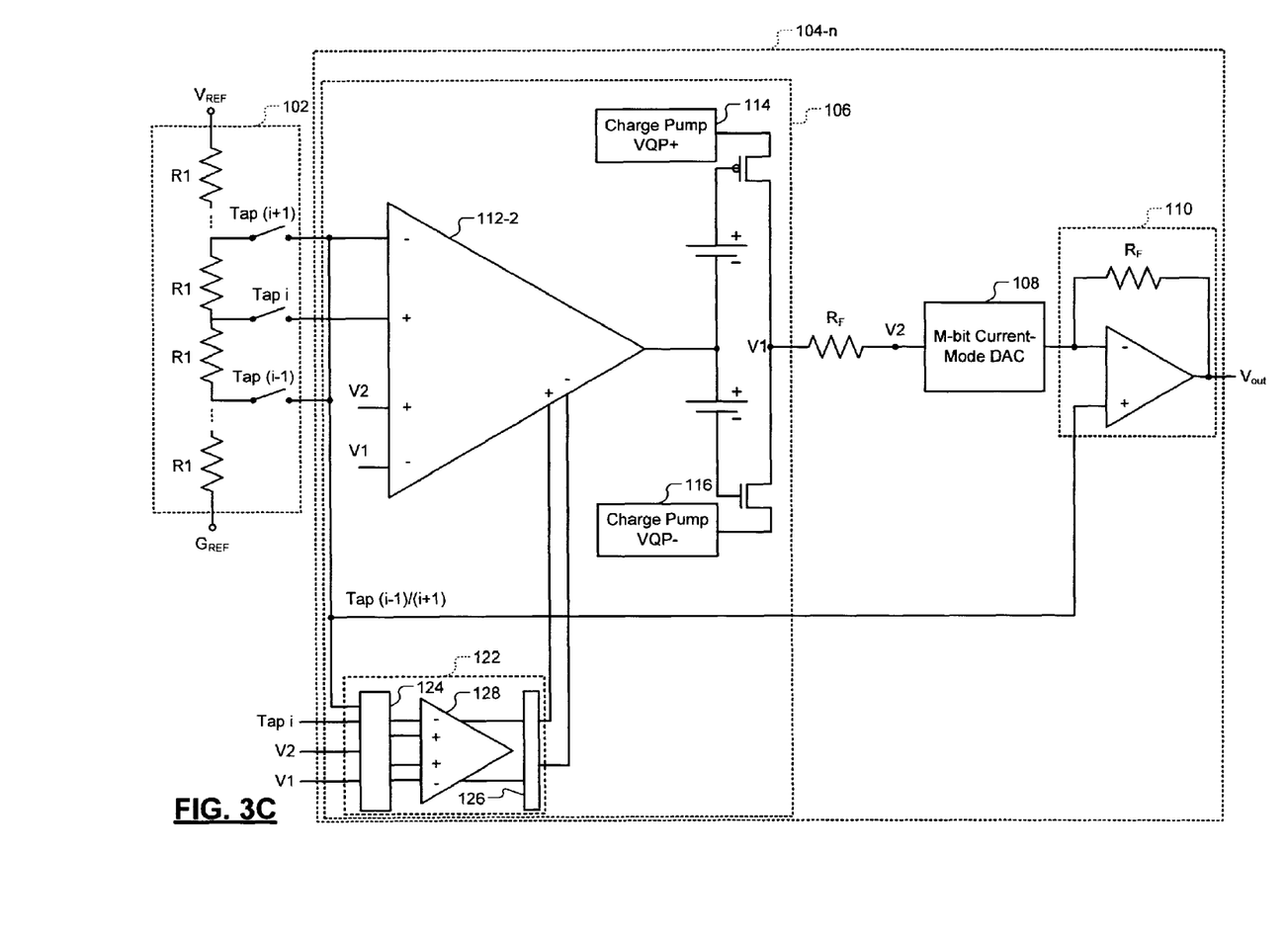
FIG. 3C depicts a schematic of a DAC architecture including a differential difference amplifier, a differential difference nulling (auto-zero) amplifier, an M-bit current-mode sub-DAC, and an output buffer.
Figure 5A:
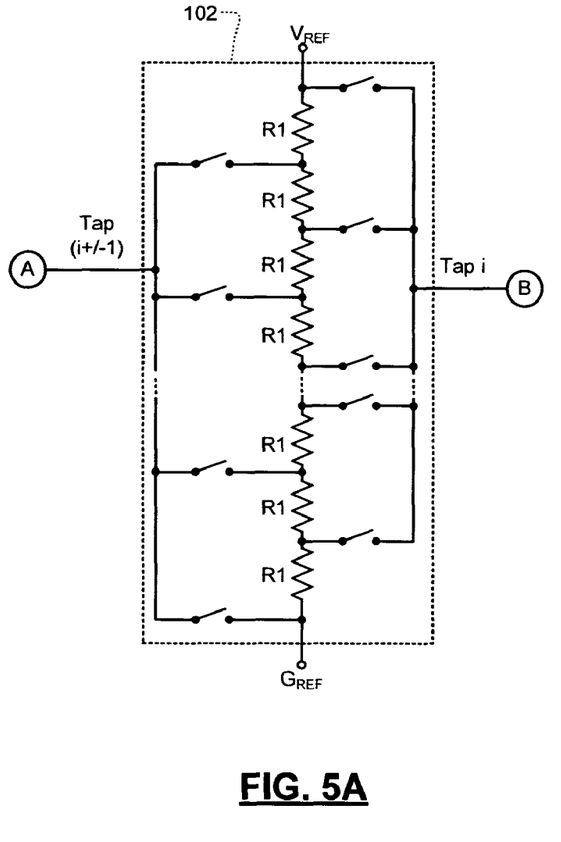
FIGS. 5A-5C depict a schematic of the DAC architecture showing another example of a configuration of a differential difference amplifier combined with the differential difference nulling (auto-zero) amplifier used in each of the multiple DAC channels.
Figure 5B:
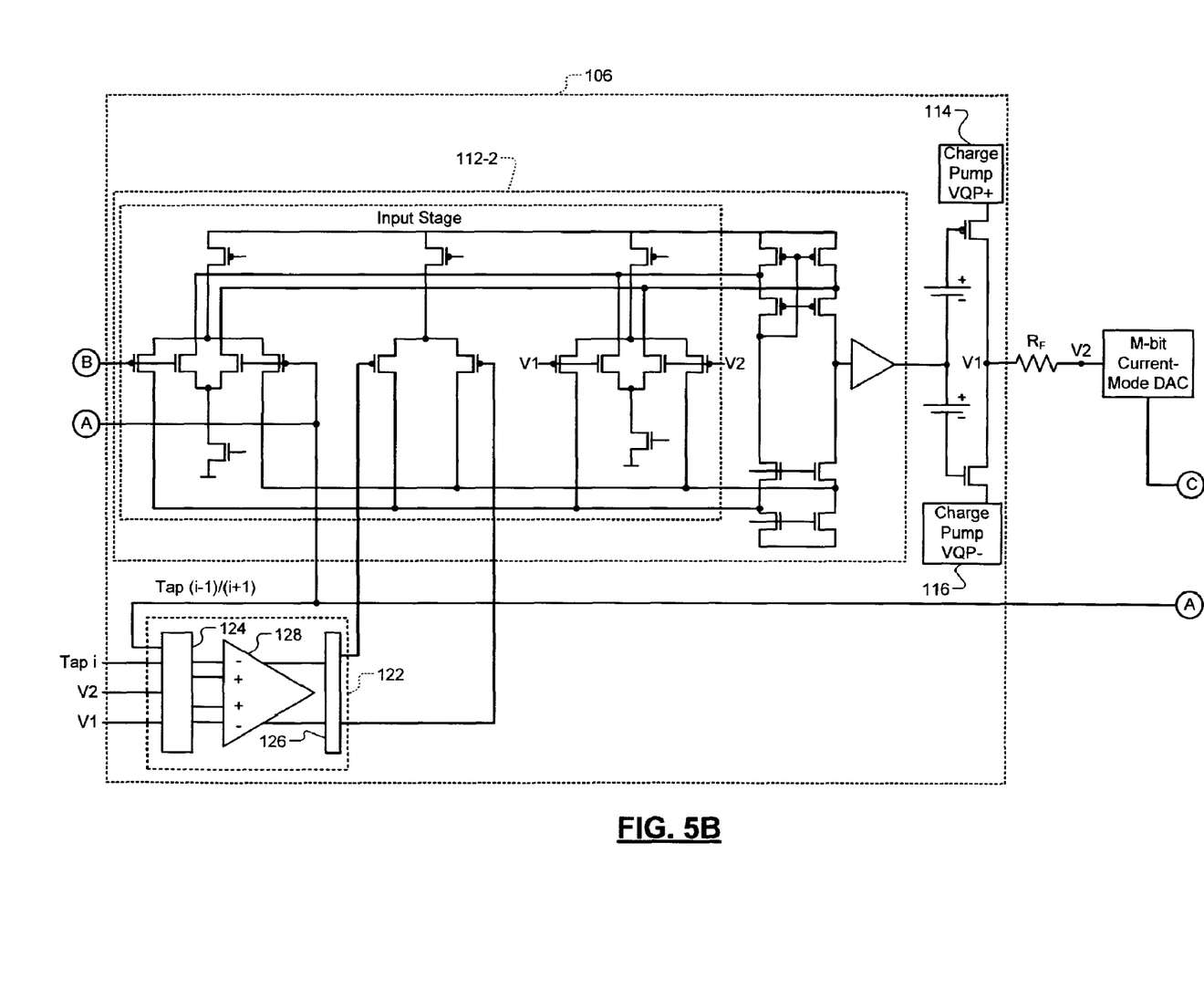
Figure 5C:
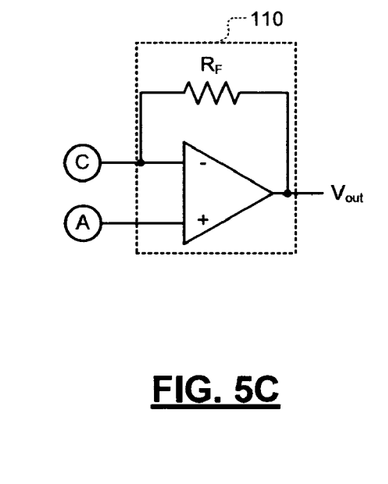

Referring now to FIGS. 5A-5C, another example of a configuration of the differential difference amplifier 112 (denoted as 112-2) is shown. Again, for simplicity of illustration and for the sake of completeness, FIGS. 5A, 5B, and 5C respectively show the first DAC 102, the differential difference amplifier 112-2, and the I-V converter 110 of the IC 100 or the IC 100-1. FIG. 3C shows a simplified schematic of the DAC architecture shown in FIGS. 5A-5C, where the details of the differential difference amplifier 112-2 shown in FIG. 5B are omitted for simplicity of illustration.

In this example configuration, as shown in FIGS. 3C and 5B, a CT Differential Difference nulling amplifier (auto-zero) 122 is used to remove any offset and common mode rejection ratio (CMRR) errors in the differential difference amplifier 112-2. Using the CT auto-zero amplifier 122 reduces die area and component count of the integrated circuit, since offset/offset tempco trim circuitry is no longer required.

The auto-zero feature allows the use of complementary MOS input devices in the differential difference amplifier 112-2. Without the auto-zero feature, complementary MOS devices, would cause common mode rejection errors, which in turn would result in additional linearity errors. While leapfrogging techniques can remove DNL errors, INL errors remain. The CT auto-zero operation removes the INL errors as well.

In FIG. 5B, the differential difference amplifier 112-2 uses complementary MOS devices instead of using charge pumps in the input stage. In the input stage, the PMOS devices are active (i.e., on) and the NMOS devices are inactive (i.e., off) when the inputs of the differential difference amplifier 112-2 are connected to a resistor in the lower half of the resistor string of the first DAC 102. Conversely, the NMOS devices are active (i.e., on) and the PMOS devices are inactive (i.e., off) when the inputs of the differential difference amplifier 112-2 are connected to a resistor in the upper half of the resistor string of the first DAC 102.

Figure 5D:
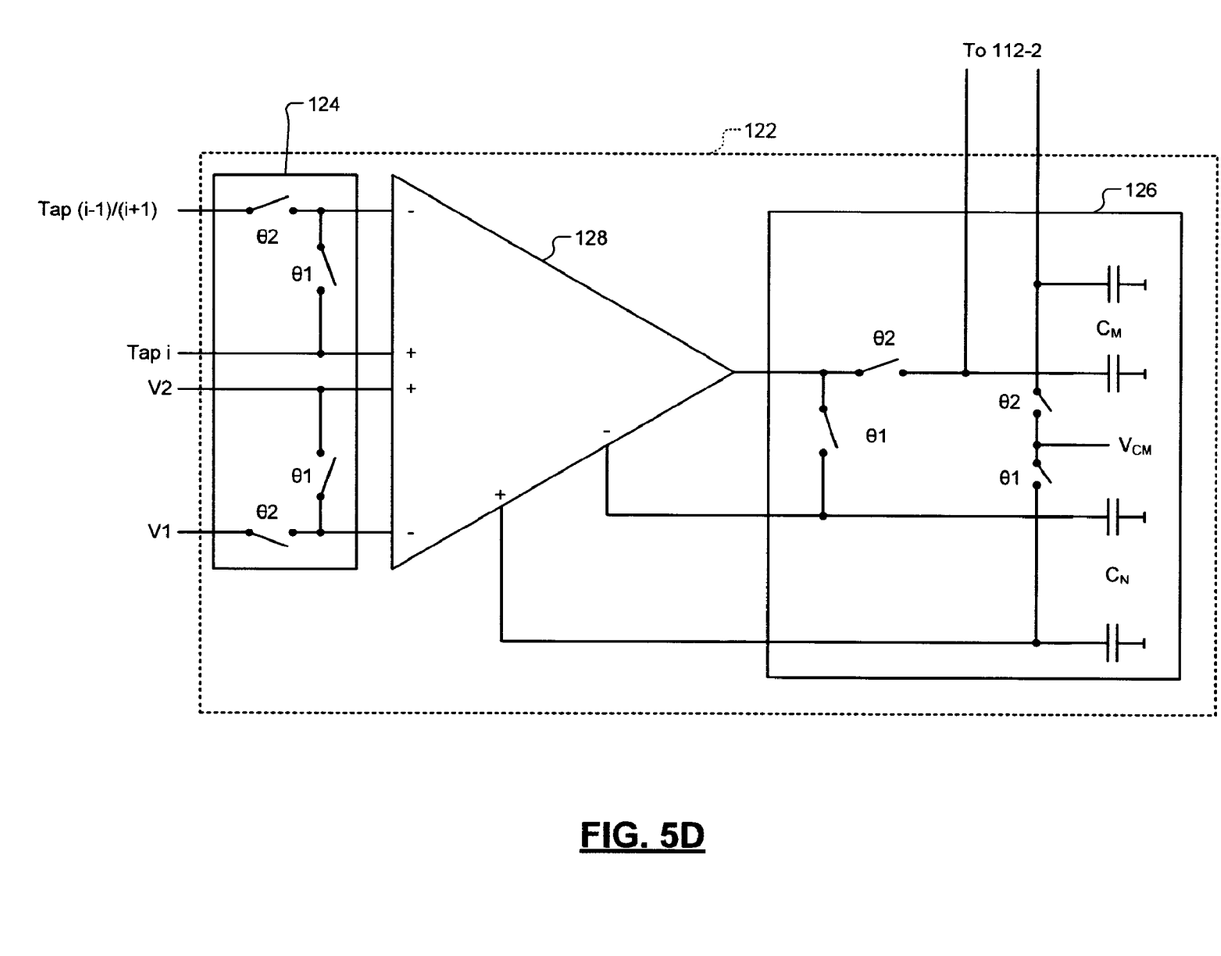
FIG. 5D is a schematic of one possible implementation of a continuous time differential difference nulling (auto-zero) amplifier used in the DAC architecture shown in FIGS. 5A-5C.

Referring now to FIG. 5D, the CT differential difference nulling (auto-zero) amplifier 122 is shown in detail. The CT auto-zero amplifier 122 includes an input switch network 124, an auto-zero switch network 126, and a differential difference amplifier 128. In FIG. 5B, using the input switch network 124, the CT auto-zero amplifier 122 samples the input to the differential difference amplifier 112-2. The CT auto-zero amplifier 122 also receives the voltages V1 and V2 generated at the two ends of the resistor $R_F$ that are fed back to the differential difference amplifier 112-2. Using the auto-zero switch network, the CT auto-zero amplifier 122 changes the output of the differential difference amplifier 112-2 such that the voltage across the Tap points Tap i—Tap (i−1) or Tap (i+1)—Tap i is the same as the voltage across the resistor $R_F$ V2-V1. Any glitches that may result due to auto-zero operation can be filtered.

Figure 6:
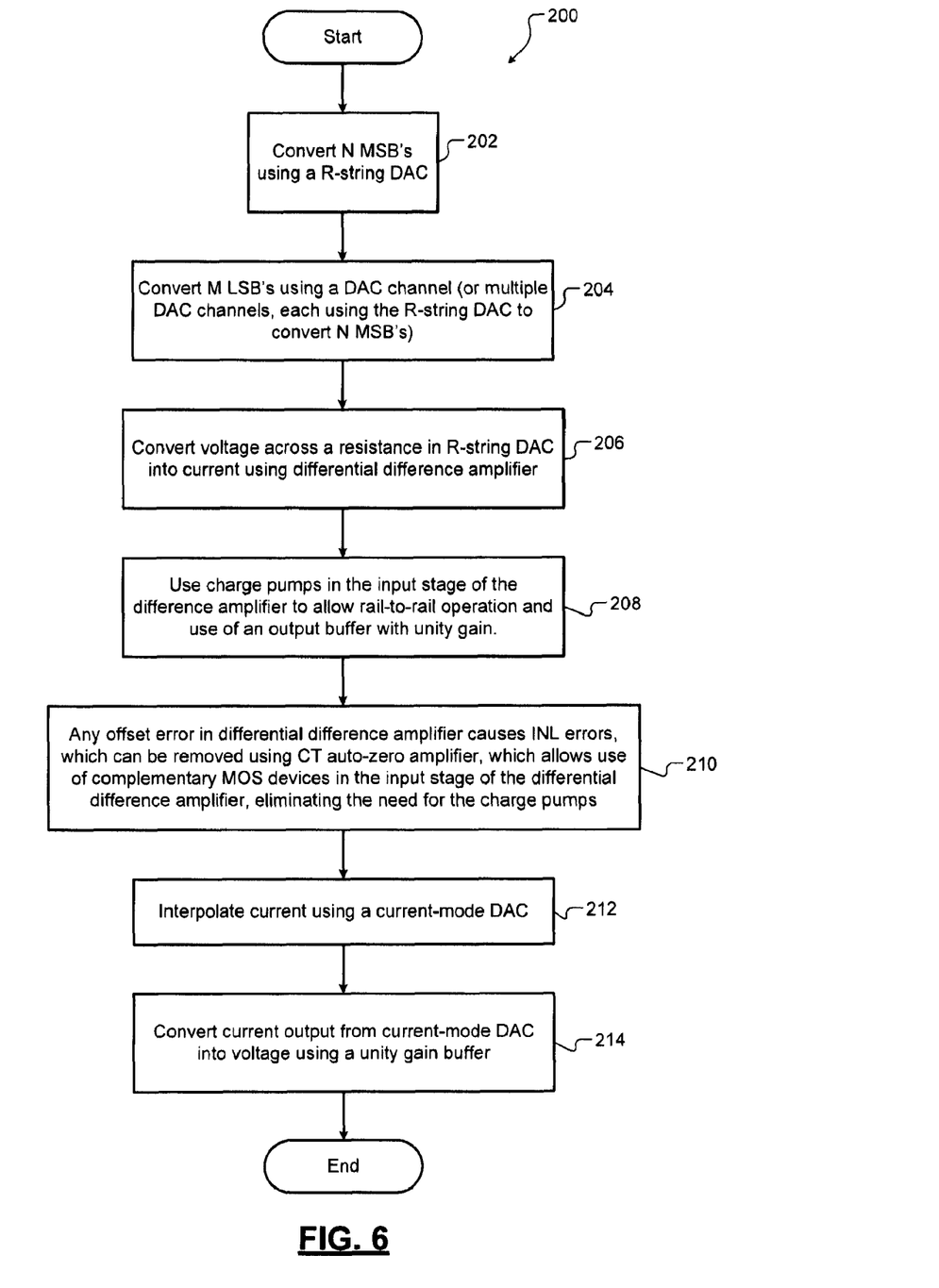
FIG. 6 a flowchart of a method for integrating a primary DAC and a single DAC channel or a primary DAC and multiple DAC channels on a single die of an integrated circuit.

Referring now to FIG. 6, a method 200 for integrating a primary DAC and a single DAC channel or a primary DAC and multiple DAC channels on a single die of an integrated circuit is shown. At 202, N most significant bits are converted using a resistor string DAC. At 204, M least significant bits are converted using a single DAC channel or multiple DAC channels, where each DAC channel (or the single DAC channel) uses the resistor string DAC to convert N most significant bits. At 206, a voltage across a resistance in the resistor string DAC is converted into a current using a differential difference amplifier. At 208, rail-to-rail common mode range can be achieved and an output buffer with unity gain configuration can be used by using charge pumps in the input stage of the differential difference amplifier.

At 210, any offset error in the differential difference amplifier will result in INL errors. These errors can be removed using a CT differential difference nulling (auto-zero) amplifier. The auto-zero operation also allows usage of complementary MOS devices in the input stage of the differential difference amplifier, eliminating the necessity of charge pumps in the input stage of the differential difference amplifier. At 212, a current-mode DAC interpolates the current output by the differential difference amplifier. At 214, the current output by the current-mode DAC is converted into an output voltage using a unity gain buffer configuration. In each DAC channel, the output voltage is an analog representation of (N+M) bits converted by the first DAC and the current mode DAC of the respective DAC channel (or the single DAC channel).

For high resolution DAC, the primary DAC must be trimmed for INL to account for resistor mismatch and gradient errors. The M-bit current-mode sub-DAC can include a trim DAC to trim the primary string with a minimal additional area penalty. The feature allows very fast INL trim at final test level or a fast self-trim capability if a high resolution comparator and associated SAR logic is incorporated on the die.

In sum, the present disclosure relates generally to data converters and more particularly to digital-to-analog converters (DACs) for DC/low frequency applications. The architecture disclosed herein includes a two-stage converter with a primary stage to resolve the higher order bits and a sub-DAC interpolator stage to resolve the lower order bits, which are combined into a corresponding high resolution analog output signal.

The architecture reduces power dissipation, silicon area, and cost and component count required to implement high resolution DACs, which facilitates higher levels of integration. The architecture converts the voltage across any primary stage tap, selected by MSB's, into an equivalent current. The architecture then interpolates this current based on the lower order bits. The architecture converts the interpolated current into an output voltage, producing a high resolution DAC function.

The architecture can be used to increase the resolution of resistor string DACs without a heavy penalty in component count and area. While buffers, direct LSB loading of primary, and $g_m$ interpolation can be used to minimize component count and area, interpolators in ≥2 gain configurations degrade noise. Buffers and other techniques also have other limitations.

Instead, the architecture shown in FIG. 3B uses an N bit primary resistor string with $2^N$ elements (e.g., N=7, MSB's). A differential difference amplifier converts the voltage across any primary element into an equivalent current based on the input MSB's. This current is fed into a current DAC as reference. An M bit (e.g., M=9, LSB's) current mode DAC (e.g., R2R/W2W) interpolates the current with the LSB's. A rail-to-rail common mode rejection (CMR) output buffer converts this current into voltage and sums the MSB's tap voltage, producing the final output with N+M bit resolution. The current DAC incorporates integral nonlinearity (INL) trim. As shown in FIG. 4B, the wide common mode interpolator and output buffer are realized with positive and negative charge pumps. VQP+NQP− charge pump is required for interpolator due to Gain=1 configuration, which provides lower noise and other improvements.

The architecture of the present disclosure is inherently monotonic with leap frogging. Any current mode DAC can be used for the sub-dac (e.g., R2R/W2W). A W2W sub-dac can be more area efficient, while an R2R sub-dac can have better linearity. The interpolator area is smaller than $g_m$ interpolators, which provides significantly smaller primary string loading than $g_m$ interpolators. The architecture has lower noise due to smaller primary string and unity gain configuration. The architecture has the ability to use digital trim (self-trim), which reduces final test time. The architecture is implemented using a very low offset difference amplifier for V/I converter (Autozero techniques) and a wide CMR buffer enabled by charge pumps.

As shown in FIGS. 3C and 5B, any DAC INL error resulting from interpolator offset/CMRR tempco errors (where CMRR denotes common mode rejection ratio and tempco denotes temperature coefficient) can be corrected using 2 temperature tempco trim, which requires trim area, or using Continuous Time (CT) auto-zero, which requires significantly less area than trim. CT auto-zero removes offset/CMRR errors. Complex circuitry to optimize CMRR (e.g., at 16-bit level) is not required. Interpolator input device size is reduced, which minimally loads the primary string and reduces glitch and cross-talk. CT auto-zero allows use of complimentary NMOS/PMOS input stages. Tail currents do not require charge pumps. Charge pump voltage requirement is reduced to $\pm(V_{SAT}+\Delta V_R 2R)$ instead of $\pm 2V$. Glitches due to auto-zero operation can be filtered.

Alternatively, $g_m$ interpolation using matched differential pairs or followers can be used. For high resolution, however, the following requirements must be met when $g_m$ interpolation is used: Gain≥2 output buffer is required for $V_{REF}=V_{DD}$ operation. Complex circuitry is required to minimize CMRR effects, or high voltage negative charge pump is required. Large tail current devices and input device ratios are required, which impose a significant area penalty and high capacitive loading on primary.

Instead, the architecture disclosed herein uses less area, is simpler to test and trim, and provides lower noise. In the architecture, a small difference amplifier converts the voltage across a DAC primary element to an equivalent current. The difference amplifier combined with an offset nulling amplifier (AZ) removes any offset/CMRR effects, which improves INL. A simple current mode (e.g., R2R/W2W) sub-DAC interpolates the current. An output buffer converts the interpolating current to an interpolating voltage and adds it to the primary tap voltage. INL trim incorporated in the current mode sub-dac results in a minimal area penalty. The architecture allows for self-trim and provides a path to 1 LSB INL, with minimal test time.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A system comprising:
    an N-bit digital-to-analog converter that comprises $2^N$ resistances connected in series across first and second reference voltages and that converts N most significant bits of B bits of data; and
    an M-bit sub-digital-to-analog converter that converts M least significant bits of the B bits of data,
    wherein the M-bit sub-digital-to-analog converter comprises:
    a first converter that converts a voltage across one of the $2^N$ resistances to a first current;
    a current-mode digital-to-analog converter that interpolates the first current and outputs a second current; and
    a second converter that converts the second current to an output voltage representing the N most significant bits and the M least significant bits of the B bits of data.

2. The system of claim 1 further comprising a second M-bit sub-digital-to-analog converter that converts M least significant bits of second B bits of data, wherein the N-bit digital-to-analog converter converts N most significant bits of the second B bits of data.

3. The system of claim 1 wherein the first converter includes a differential difference amplifier that outputs the first current through a first resistance to the current-mode digital-to-analog converter and that receives voltages at first and second terminals of the first resistance as feedback.

4. The system of claim 3 wherein a first input of the differential difference amplifier is connected to a first node formed by first terminals of two of the $2^N$ resistances and wherein a second input of the differential difference amplifier is connected to a second terminal of a first of the two resistances at a first time and to a second terminal of a second of the two resistances at a second time.

5. The system of claim 4 wherein the second converter includes a buffer having a first input connected to an output of the current-mode digital-to-analog converter, a second input connected to the second input of the differential difference amplifier, and an output connected to the first input of the buffer via a second resistance that is equal to the first resistance.

6. The system of claim 5 further comprising a plurality of charge pumps connected to the differential difference amplifier that allows the first reference voltage to be raised to a supply voltage and that allows the buffer to operate in a unity gain configuration.

7. The system of claim 5 wherein the buffer has a gain of greater than 1.

8. The system of claim 5 further comprising a continuous time differential difference offset nulling amplifier that has first and second inputs respectively connected to the first and second inputs of the differential difference amplifier, that receives the voltages at the first and second terminals of the first resistance as feedback, and that removes offset and common-mode rejection ratio errors from an output of the differential difference amplifier.

9. The system of claim 8 wherein the continuous time differential difference offset nulling amplifier allows use of complementary metal-oxide semiconductor field-effect transistors as input devices in the differential difference amplifier to allow rail-to-rail operation without CMRR degradation instead of using a plurality of charge pumps.

10. A method comprising:
converting N most significant bits of B bits of data using an N-bit digital-to-analog converter comprising $2^N$ resistances connected in series across first and second reference voltages;
converting M least significant bits of the B bits of data using an M-bit sub-digital-to-analog converter; and
in the M-bit sub-digital-to-analog converter:
converting a voltage across one of the $2^N$ resistances to a first current;
interpolating the first current to output a second current; and
converting the second current to an output voltage representing the N most significant bits and the M least significant bits of the B bits of data.

11. The method of claim 10 further comprising:
converting M least significant bits of second B bits of data using a second M-bit sub-digital-to-analog converter; and
converting N most significant bits of the second B bits of data using the N-bit digital-to-analog converter.

12. The method of claim 10 further comprising:
converting the voltage across one of the $2^N$ resistances to the first current using a differential difference amplifier;
interpolating the first current using a current-mode digital-to-analog converter;
outputting the first current through a first resistance to the current-mode digital-to-analog converter; and
providing feedback of voltages generated at first and second terminals of the first resistance to the differential difference amplifier.

13. The method of claim 12 further comprising:
connecting a first input of the differential difference amplifier to a first node formed by first terminals of two of the $2^N$ resistances; and
connecting a second input of the differential difference amplifier to a second terminal of a first of the two resistances at a first time and to a second terminal of a second of the two resistances at a second time.

14. The method of claim 13 further comprising:
converting the second current to the output voltage using a second converter;
connecting a first input of the second converter to an output of the current-mode digital-to-analog converter;
connecting a second input of the second converter to the second input of the differential difference amplifier; and
providing feedback from an output of the second converter to the first input of the second converter via a second resistance that is equal to the first resistance.

15. The method of claim 14 further comprising coupling a plurality of charge pumps to the differential difference amplifier to allow the first reference voltage to be raised to a supply voltage and to allow the second converter to operate in a unity gain configuration.

16. The method of claim 15 further comprising operating the second converter with a gain of greater than 1.

17. The method of claim 14 further comprising:
connecting first second inputs of a continuous time differential difference offset nulling amplifier to the first and second inputs of the differential difference amplifier;
providing feedback of the voltages at the first and second terminals of the first resistance to the continuous time differential difference offset nulling amplifier; and
removing offset and common-mode rejection ratio errors from an output of the differential difference amplifier.

18. The method of claim 17 further comprising using the continuous time differential difference offset nulling amplifier to allow use of complementary metal-oxide semiconductor field-effect transistors as input devices in the differential difference amplifier instead of using a plurality of charge pumps to allow the first reference voltage to be raised to a supply voltage and to allow the second converter to operate in a unity gain configuration.

19. The method of claim 18 further comprising operating the second converter with a gain of greater than 1.

* * * * *

UNITED STATES PATENT AND TRADEMARK OFFICE
CERTIFICATE OF CORRECTION

PATENT NO. : 8,907,831 B1  
APPLICATION NO. : 14/136728  
DATED : December 9, 2014  
INVENTOR(S) : Syed Amir Aftab It is certified that error appears in the above-identified patent and that said Letters Patent is hereby corrected as shown below:

In the Specification:

| | |
|---|---|
| Column 6, Line 15 | Delete "106" and insert --112-- |
| Column 6, Line 38 | Delete "106" and insert --112-- |
| Column 6, Line 46 | Delete "106" and insert --112-- |

Signed and Sealed this
Twelfth Day of May, 2015

Michelle K. Lee  
*Director of the United States Patent and Trademark Office*